United States Patent [19]

Butt et al.

[11] Patent Number: 4,961,106
[45] Date of Patent: Oct. 2, 1990

[54] METAL PACKAGES HAVING IMPROVED THERMAL DISSIPATION

[75] Inventors: Sheldon H. Butt, Godfrey, Ill.; Deepak Mahulikar, Meriden, Conn.

[73] Assignee: Olin Corporation, New Haven, Conn.

[21] Appl. No.: 91,470

[22] Filed: Aug. 31, 1987

Related U.S. Application Data

[63] Continuation-in-part of Ser. No. 30,522, Mar. 27, 1987, abandoned.

[51] Int. Cl.[5] .................. H01L 23/02; H01L 23/12
[52] U.S. Cl. .................................. 357/74; 357/78; 357/81; 357/82
[58] Field of Search .................. 357/74, 78, 81, 82, 357/80

[56] References Cited

U.S. PATENT DOCUMENTS

| | | | |
|---|---|---|---|
| 3,340,347 | 9/1967 | Spiegler | 174/52 FP |
| 3,396,361 | 8/1968 | Sussman | 357/81 |
| 3,469,017 | 9/1969 | Starger | 174/52 FP |
| 3,586,926 | 6/1971 | Nakamura | 317/234 R |
| 3,993,123 | 11/1976 | Chu et al. | 357/82 |
| 4,314,270 | 2/1982 | Iwatani | 357/75 |
| 4,404,739 | 9/1983 | Kiley et al. | 357/79 |
| 4,481,525 | 11/1984 | Calabro et al. | 357/81 |
| 4,491,622 | 1/1985 | Butt | 428/632 |
| 4,501,060 | 2/1985 | Frye et al. | 357/73 |
| 4,517,584 | 5/1985 | Matsushita et al. | 357/80 |
| 4,524,238 | 6/1985 | Butt | 174/52 FP |
| 4,552,206 | 11/1985 | Johnson et al. | 165/80.3 |
| 4,570,337 | 2/1986 | Butt | 29/840 |
| 4,583,283 | 4/1986 | Dubois et al. | 357/80 |
| 4,592,794 | 6/1986 | Davis et al. | 357/80 |
| 4,622,433 | 11/1986 | Frampton | 357/74 |
| 4,630,095 | 12/1986 | Otsuka et al. | 357/74 |

OTHER PUBLICATIONS

Betz et al., Monolithic Chip Carrier, IBM Tech. Disc. Bull., vol. #9, #11, Apr. 1967, p. 1511.
Vestrout, V. D., Dendritic Heat Sink, IBM Tech. Disc. Bull., vol. 22, #2, Jul. 1979, p. 536.
Wrap-Around Heat Sink, by G. L. Bond et al., IBM Technical Disclosure Bulletin, vol. 20, No. 4, Sep., 1977.

*Primary Examiner*—Rolf Hille
*Assistant Examiner*—Hoanganh Le
*Attorney, Agent, or Firm*—Gregory S. Rosenblatt; Paul Weinstein

[57] ABSTRACT

A package adapted to encase an electronic component is disclosed. The package comprises a metallic lid component disposed on a metallic base component to form an enclosure adapted to receive said electronic component. A metallic leadframe is disposed between the base and lid components and is glass or polymer sealed therebetween. The base component is split into first and second base layers which are bonded together at their interface with a layer of electrically insulating glass or polymer. In one embodiment, the first and second base layers are bonded only around the edges of their interface, with the internal cavity thereby formed filled with a fluid or powder to enhance heat transfer between the layers. A fluid or powder may also be placed in the electronic component enclosure for further enhancement of heat transfer from the electronic component.

40 Claims, 4 Drawing Sheets

METAL PACKAGES HAVING IMPROVED THERMAL DISSIPATION

This application is a Continuation-In-Part of U.S. patent application Ser. No. 30,522, now abandoned.

The present application relates to U.S. Pat. Nos. 4,491,622 entitled "Composites Of Glass-Ceramic To Metal Seals And Method Of Making The Same", by Sheldon H. Butt, 4,570,337 entitled "Method of Assembling A Chip Carrier", by Sheldon H. Butt and U.S. patent application Ser. No. 826,808, now U.S. Pat. No. 4,929,516, entitled "Semiconductor Die Attach System", by Michael J. Pryor et al. The patents and patent application relate to packaging of electronic components and are assigned to a common assignee.

BACKGROUND OF THE INVENTION

While the invention is subject to a wide range of applications, it particularly relates to a package adapted to encase an electronic component. In particular, the package provides enhanced heat transfer from an electronic component that is isolated from the base component of the package.

It is often desirable to electrically isolate an electrical device such as a silicon die from the base component of the package in which the semiconductor die is enclosed. The dies are often biased on the side bonded to the package. If the base component is electrically conductive, i.e. constructed of metal, it may be especially important to isolate the die from the base component in case the base of the package inadvertently contacts the surface, i.e. the circuit board to which it is attached and thereby causing a malfunction, such as a short ciruit. Electrical isolation between the device and the base of the package may be particularly important for discrete devices having high voltage and high power.

An example of an electrical device which is electrically isolated from its package is disclosed in U.S. patent application Ser. No. 26,808 where a semiconductor die attach system includes, in one embodiment, an electrically insulating buffer disposed between the semiconductor die and the base. Thermally conductive materials such as a silver glass die attach material or a silver alloy solder may be employed to attach the buffer to the die and to the base component. At least one of the die attach materials is compliant so as to accommodate the mismatch in the coefficients of thermal expansion between the die and of the base material. The buffer may be constructed of electrically insulating material such as, for example, a ceramic. A ceramic buffer would be resistant to heat transfer. This could partially be overcome by selecting a beryllia ceramic. However, beryllia is expensive and typically requires a metallized surface for bonding to the solder die attach materials. Moreover, to prevent silver migration from the die attach material into the buffer, which could form a conductive bridge across the buffer, the metallization on the buffer is preferably gold. Also, care must be taken to avoid bridging the solder around the edge of the ceramic buffer so as to form a conductive bridge across the buffer. Although a thicker buffer will normally prevent this type of bridging problem, it adds to the cost and increases the heat resistance.

In a conventional metal package, the heat transfer path from the silicon die to the metal base is essentially limited to the size of the die because the resistance to heat transfer from the die to the outer surface of the base is a function of the area provided for heat transfer. Therefore, it would be advantageous to enlarge the interfacial heat transfer surface.

It is an aim of the present invention to provide a package adapted to encase an electronic component which avoids the problems and difficulties encountered by the prior art approaches.

It is a further aim of the present invention to provide a package adapted to encase an electronic component having enhanced heat transfer from the electronic component to the environment external to the package.

It is a yet further aim of the present invention to provide a package adapted to encase an electronic component which is relatively inexpensive to manufacture.

SUMMARY OF THE INVENTION

Accordingly, there is provided a package adapted to encase an electronic component. The package comprises a metallic lid component disposed on a metallic base component to form an enclosure adapted to receive an electronic component. A metallic leadframe is disposed between the base and lid components and is glass or polymer sealed therebetween. The electronic component is attached to the base component. The base component is split into first and second base layers which are bonded together at their interface with a layer of electrically insulating glass or polymer so as to electrically isolate the electronic component from the second base layer. In one embodiment, the first and second base layers are bonded only around the edges of their interface, with the internal cavity thereby formed filled with a fluid or insulating solid to enhance heat transfer between the base layers. A fluid may also be placed in the electronic component enclosure for further enhancement of heat transfer from the electronic component.

These and other aims will become more apparent from the following description and drawings in which like elements have been given like reference numbers and in which prime or multiprimed numbers comprise similar elements providing similar functions.

DESCRIPTION OF THE PREFERRED EMBODIMENTS

Figure 1:
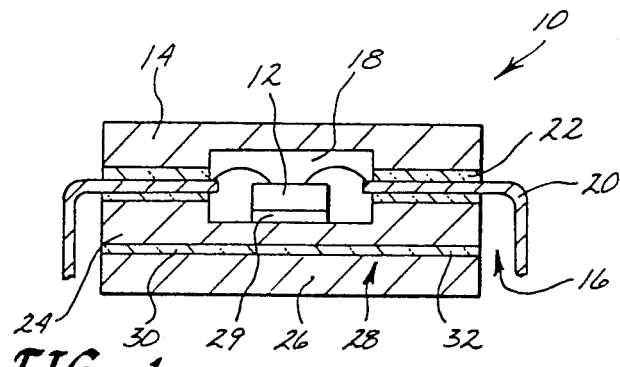
FIG. 1 illustrates a cross section of a package for an electronic device in accordance with the present invention.

The present invention is particularly directed to a package 10 adapted to encase an electronic component 12. The package comprises a metallic lid or cover component 14 and a metallic base component 16. The lid component 14 is stacked on the base component 16 to form an enclosure 18 adapted to receive the electronic component 12. A metallic leadframe 20 is disposed between the lid component 14 and the base component 16. A sealing glass or polymer 22 seals the lid component 14 to the base component 16 with the leadframe 20 therebetween. The base component 16 is split into first and second base layers 24 and 26, respectively. The first and second base layers 24 and 26 are bonded together at their interface 28 with a layer 30 of electrically insulating glass or polymer 32.

Referring to FIG. 1, there is illustrated a metal package 10 for hermetically sealing an electronic component 12, such as a semiconductor device within an enclosure 18. The lid and base components 14 and 16 are constructed of a metal or alloy selected from the group consisting of copper, aluminum, nickel, iron and alloys thereof. Preferably, the particular metal or alloy selected for the base and/or lid is rigid and possesses good thermal conductivity. Moreover, the metal or alloy is preferably glass sealable. Metals and alloys suitable for constructing the packages of the present invention are disclosed in U.S. Pat. No. 4,805,009.

The leadframe 20 is also formed of a metal or alloy which may be selected from the group consisting of copper, aluminum, nickel, iron and alloys thereof. The metal used for any of the components of the package 10 may be substituted for by any desirable metal or alloy. An important characteristic of the leadframe 20 is its high electrical conductivity; although in certain applications, this may not be critical to the invention. However, it is important that the metal components be glass sealable. If necessary a coating, such as an aluminum oxide may be formed on the leadframe 20, base 16 or lid 14 to enhance the bond strength with the sealing glass 22.

The sealing glass 22 is preferably formed of a glass matrix selected from the group consisting of borate, borosilicate, lead borate, lead-zinc borate, lead borosilicate and lead-zinc borosilicate glasses. A second component is mixed into the glass matrix for increasing the effective coefficient of thermal expansion of the resulting glass composite to reduce the mismatch between its coefficient of thermal expansion and that of the lid and base components 14 and 16, respectively. The second component can consist essentially of an effective amount up to about 30 wt. % of a particulate additive. The particulate additive has limited solubility in the glass matrix, a higher coefficient of thermal expansion than that of the glass matrix and a melting point higher than that of the glass matrix. In addition, a copper oxide may be added to the glass matrix for improving the glass to metal bond strength. This glass is disclosed in U.S. Pat. Nos. 4,818,730 and 4,752,521 and U.S. patent application Ser. No. 848,601. Although it may be desirable to include the copper oxide, the sealing glass without the latter addition is more fully discussed in U.S. Pat. Nos. 4,801,488 and 4,775,647 and U.S. patent application Ser. No. 157,178 which is a continuation of U.S. patent application Ser. No. 849,091 (now abandoned). Rather than use a sealing glass, the use of a sealing polymer from the group consisting of thermoplastic and thermoset polymers, for example a epoxy, may be used. Throughout this specification, where a sealing glass is used, a suitable polymer may be used as an alternative.

The present invention is particularly directed to splitting the base component 16 into first and second base layers 24 and 26, respectively. The first and second base layers 24 and 26 may both be of the same metallic material or the second base layer may be a cermet, such as an aluminum matrix composite. The latter may be desirable to reduce the weight of the package. The first and second base layers 24 and 26 are bonded together at their interface 28 with a layer 30 of electrically insulating glass or polymer 32. Since the first and second base layers 24 and 26 are preferably preassembled before introduction of the die 12 into the package 10, a high temperature sealing glass may be used. Glasses suitable for electrically insulating glass 32 may be selected from the group consisting of silicate, borosilicate, phosphate, zinc-borosilicate, soda lime silica, lead-zinc-borate glasses and combinations thereof. In addition, a vitreous or devitrified glass may be selected. Examples of these glasses are set forth in U.S. Pat. No. 4,882,212. Other glasses such as those prescribed in U.S. Pat. No. 4,687,540 are also thought to be useful for the present invention. The electrically insulating glass 32 may also be selected from the group consisting of a high expansivity, low temperature sealing glass of the type defined for sealing glass 22. Further, since the electrically insulating glass 32 does not necessarily have to provide a hermetic seal, it may be of a material having higher thermal conductivity, such as glass + $Al_2O_3$, glass +SiC, glass + MgO, or a high expansion glass ceramic.

Figure 2:
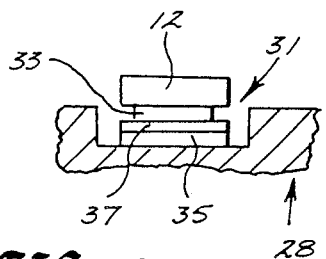
FIG. 2 is a partial cross section of a die attach system bonding an electronic device to a base component.

As illustrated in FIG. 1, the die 12 is bonded to the base 28 with a semiconductor die attach material 29. This may comprise an alloy bonding material from the group consisting of gold-silicon, gold-tin, silver-tin, silver-antimony-tin and mixtures thereof. It is also within the terms of the present invention to attach the die 12 with a semiconductor die attach system 31, as shown in FIG. 2. This may include sealing components 33 and 35 selected from the same group of alloy bonding materials as die attach material 29. A buffer 37, disposed between components 33 and 35 is preferably constructed of a metal, alloy or ceramic selected from the group consisting of tungsten, rhenium, molybdenum and alloys thereof, nickel-iron alloys and ceramics. The die 12, buffer 37 and base component 28 may include barrier and oxidation resistant layers as required. Details of each component of the semiconductor die attach 29 or 31 is more fully described in U.S. patent application Ser. No. 826,808, now U.S. Pat. No. 4,929,516.

Figure 3:
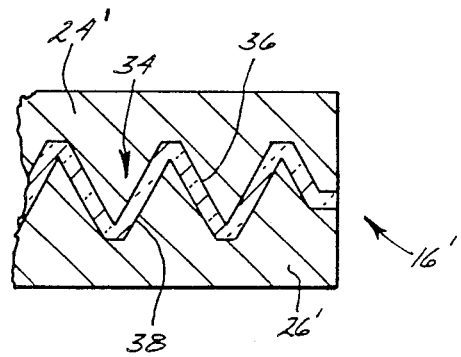
FIG. 3 is a partial section illustrating a second embodiment of the interface of a two layer metal base component.

Referring to FIG. 3, there is illustrated a base component 16' wherein the interface 34 has a saw tooth configuration to increase the interfacial area of the surface 36 of the first base layer 24' and surface 38 of the second base layer 26'. It is within the terms of the present invention to use any desired interfacial configuration as desired. The surfaces 36 and 38 of the first and second base layers 24' and 26', respectively, can be formed by any desired technique such as milling, stamping and etching.

Figure 4:
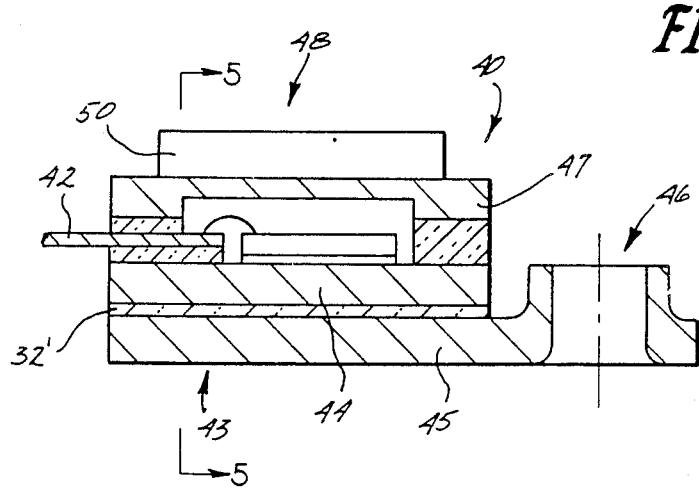
FIG. 4 illustrates a casing for a high voltage or high power device in accordance with the present invention.
Figure 5:
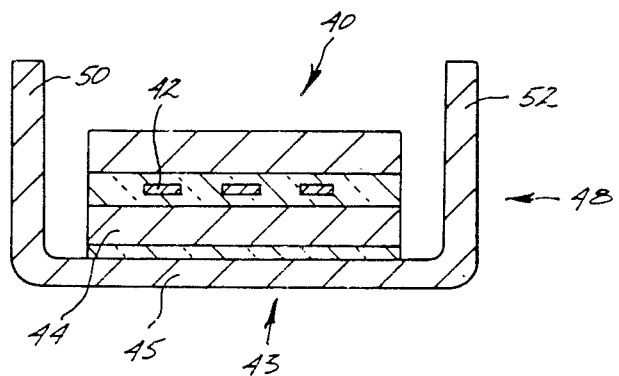
FIG. 5 illustrates a cross section of a package having cooling fins attached to the base component for enhancing heat transfer.

Referring to FIG. 4, there is illustrated a single-in-line package (SIP) power package 40 wherein the leadframe 42 extends from one side. The package is very similar to that illustrated in FIG. 1 and incorporates the same materials as those used for the similar components described hereinbefore. The base component 43 includes a first base layer 44 and a second base layer 45 separated by a layer of insulating glass 32'. The second base layer 45 includes a bolt hole 46 for attachment of the package to an external heat sink or mounting bracket (not shown). The bolt hole 46 is electrically isolated from the first base 44. A heat transfer means 48 is provided on the package 40 to enhance heat dissipation. The heat transfer means 48 may comprise cooling fins 50 and 52 as illustrated in FIG. 5, a cross-sectional view through FIG. 4. The heat transfer means 48 may protrude above the lid 47 of package 40. It is also within the terms of the present invention to construct the package without cooling fins.

Referring to FIG. 5, there is illustrated a means 48 for enhancing the heat transfer from the outside of the package 40 to the surrounding environment. Base 43 of the SIP power package illustrated in FIG. 4 has cooling fins 50 and 52 extending from the opposite ends of the second base layer 45. Although the cooling fins 50 and 52 are illustrated as extending at approximately right angles to the base layer 45, it is within the terms of the present invention for the cooling fins 50 and 52 to extend from the base layer component 45 at any desired angle. Further, the cooling fins 50 and 52 may extend upwards from the base layer component 45 for any desired height which is suitable for the particular application.

Figure 6:
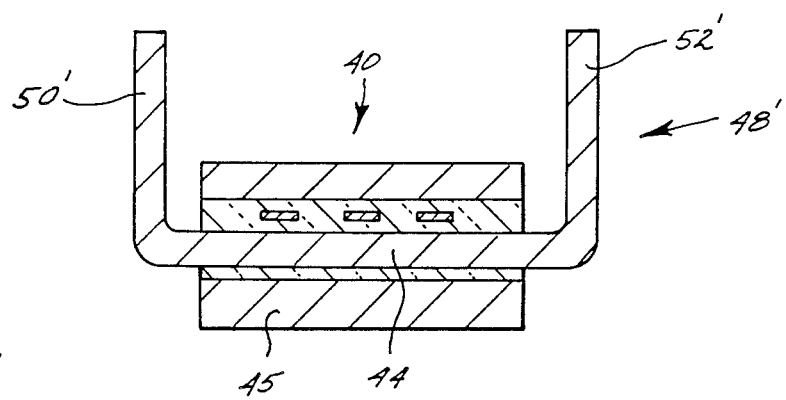
FIG. 6 illustrates another embodiment of a package having cooling fins attached to a portion of the base component for enhancing heat transfer from the package.

FIG. 6 is similar to FIG. 5 except the the package 40 includes heat transfer means 48' which includes cooling fins 50' and 52' extending outward from the ends of the first base layer 44. It is also within the terms of the present invention to have one of the cooling fins extend from the first base layer 44 and a second cooling fin extend from the second base layer 45 (not shown).

Figure 7:
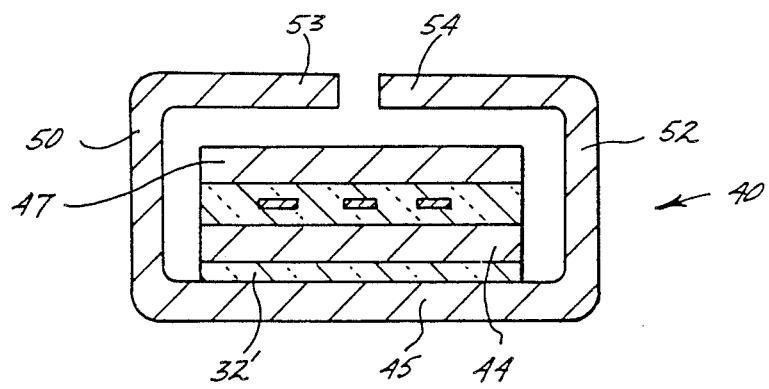
FIG. 7 illustrates a package having cooling fins extending from a base component and projecting along the sides and across the top of the package.

The length and configuration of the cooling fins 50 and 52 can be varied to suit the application. For example, as shown in FIG. 7, the ends 53 and 54 of the cooling fins 50 and 52, respectively, are bent at approximately right angles to the upstanding portions of the cooling fins 50 and 52. The ends 53 and 54 are spaced from the cover component 47 and enhance the cooling of package 40. The bending of ends 53 and 54 with respect to the cooling fins 50 and 52 is performed subsequent to the completed assembly of the package 40. Since the fins 50 and 52 are relatively thin and, therefore, easily deformable, this may be accomplished without excessive stress applied to the glass 32' which bonds the first and second base layers 44 and 45, respectively.

Figure 8:
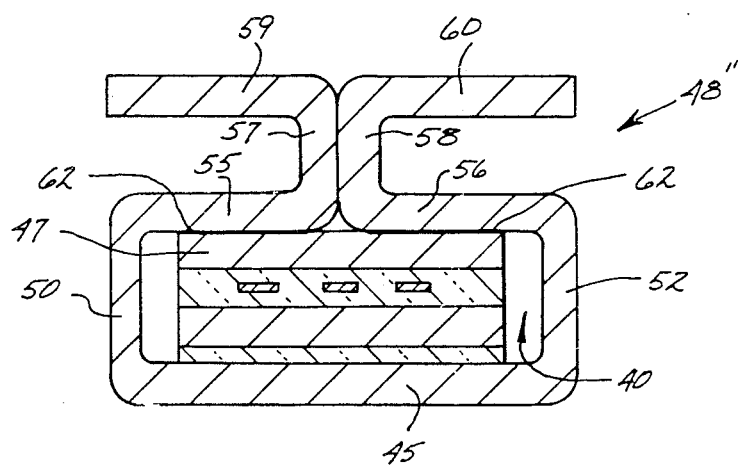
FIG. 8 sets forth a package having cooling fins attached to both the base of the package and the lid of the package.

Referring to FIG. 8, a further modification of the cooling fins is illustrated. In this embodiment, the cooling fins 50 and 52 extending upward from the second base layer 45, have portions 55 and 56 which are bent into contact with the cover 47 of the package 40. If desired, portions 55 and 56 can be soldered to cover 47 with a solder layer 62. The cooling fin portions 55 and 56 can be further lengthened with the addition of sections 57 and 58 which extend away from the cover 47. Upward extending sections 57 and 58 can than be bent to form arms 59 and 60 which may be parallel with the lid 47. The heat transfer device 48" may also be formed into any other desired configuration as desired.

The electrical resistivity of the layer 30 of electrically insulating glass 32 disposed between the first and second base layers 24 and 26, as described herein may initially be adequate. However, the resistivity may decrease due to moisture absorption. A decrease in the resistivity may create failures in the package which the electrical isolation of the device 12 from the second base layer was designed to prevent. This potential problem may be prevented by a number of novel solutions.

Figure 9:
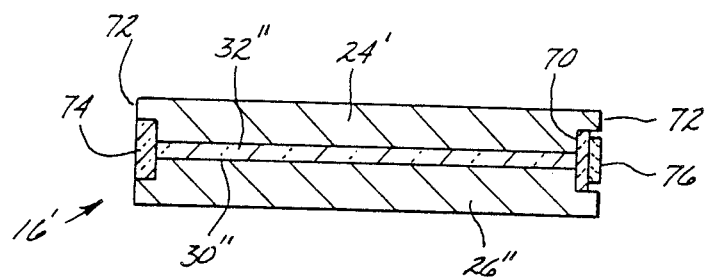
FIG. 9 illustrates a metallic base of a package for an electronic device having a material filled groove along an outer edge to prevent moisture absorption into the dielectric glass bonding the two layers of the base component together.

Referring to FIG. 9, the base component 16' may be provided with a groove 70 along each of the four sides 72 or along any one of the sides as desired. The groove 70 is partially cut into both the first and second base layers 24' and 26'. The groove can be filled with means 74 for substantially preventing moisture absorption into the layer 30" of glass 32". The means for preventing moisture absorption may include a glass 74 which is selected of a glass from the group used for sealing glass 22 or insulating glass 32". Moreover, if desired, a strip 76 of insulator material, such as a ceramic strip may be bonded in the groove 70 by the glass 74 to further prevent absorption of moisture into the glass layer 30".

Figure 10:
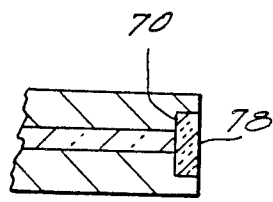
FIG. 10 illustrates a two layer metal base component having a groove extending around an outer edge filled with an organic insulation material.

Referring to FIG. 10, it is also within the terms of the present invention to replace glass 74 in groove 70 with an organic polymer resin 78 selected from the group consisting of thermoset and thermoplastic polymer resins. A number of suitable resins are disclosed in U.S. Pat. No. 4,816,426 entitled "Process For Manufacturing Plastic Pin Grid Arrays And The Product Produced Thereby", by Bridges et al. It is also within the terms of the invention, to incorporate a thin strip of insulating material, such as a ceramic insulator, in the manner described herein and illustrated in FIG. 9.

Figure 11:
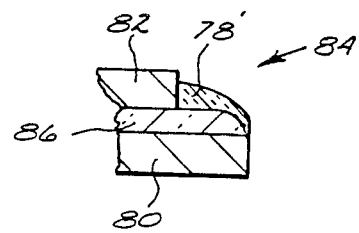
FIG. 11 illustrates a partial view of a two layer base bonded together with a glass and having a collar along an edge of one of the base layers receiving material for preventing absorption of moisture into the glass.

Referring to FIG. 11, the second base layer 80 may be of a longer length than the first base layer 82 to form a collar 84. An organic insulator 78' may be disposed on the electrical insulating glass 86 subsequent to assembly of the package. The material for the first and second base layers 80 and 82, as well as the glass 86, are substantially identical with the like components in FIG. 1.

Figure 12:
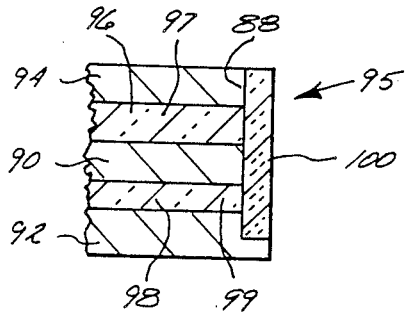
FIG. 12 is a partial cross section view of a package for an electronic device wherein a groove is provided in the side surface to receive a material to prevent absorption of water into the glass bonding layers.

Referring to FIG. 12, there is shown another embodiment where a groove 88 is provided about the edge surface of a package 10 or 40 in accordance with the present invention. It is also within the terms of the invention for the groove to extend about either of one or more sides of the package. The groove 88 is formed in the first and second base layers 90 and 92, and in the cover component 94. Each of these components are formed of materials of like components described hereinbefore with respect to packages 10 and 40. The groove 88 can be filled with means 95 for substantially preventing moisture from being absorbed in the layer 96 of sealing glass 97 and into the layer 98 of electrically insulating glass 99. The means 95 for preventing moisture absorption is illustrated as an organic material 100.

However, it is within the terms of the present invention to form the absorption preventing material 95 from a sealing glass with or without a strip of insulation such as a ceramic material, as described in the embodiment illustrated in FIG. 9.

Figure 13:
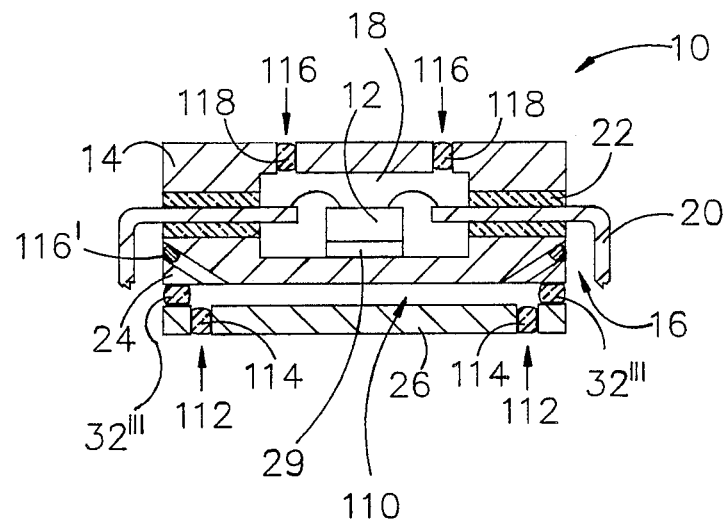
FIG. 13 is a cross section of a package adapted to have a fluid inserted in internal cavities thereof.

Referring to FIG. 13, there is shown a package 10', similar to package 10 on FIG. 1, except that package 10' is adapted to have fluid placed in internal cavities to enhance heat transfer. Here, the sealing glass or polymer 32''' is placed only at the edges of the first and second base layers 24 and 26, thus forming therebetween a cavity 110.

Minimizing the amount of sealing glass or polymer 32''', which is a highly efficient thermal insulator, helps to promote heat transfer from the first to the second base layers 24 and 26 respectively. In some cases, ambient air trapped in the cavity 110 during the manufacturing process provides a medium for convective and conductive heat transfer between the layers. In other cases, it may be advantageous to employ fluids having more efficient heat transfer characteristics. In the latter cases, the second base layer 26 would be provided with conduits 112. After the first and second base layers 24 and 26 are bonded together with sealing glass or polymer 32''', one of conduits 112 is used to introduce the fluid into cavity 110, while the other conduit 112 is used to exhaust air from the cavity. After filling the cavity 110 with the fluid, plugs 114 are formed in conduits 112, thereby sealing cavity 110. The plugs 114 may be formed of any suitable material know in the art, such as solder glass or a polymer. It is also within the intent of the present invention to leave the cavity 110 open by bonding only two opposing edges of the interface of the first and second base layers, so that free air may flow through cavity 110 for cooling by natural convection or a fluid may be forced through the cavity for a greater degree of cooling.

If desired, a fluid other than air may also be placed in the enclosure 18. In this case, conduits 116 would be provided in the lid 14 for the introduction of the fluid into the enclosure 18 as described above with reference to filling the cavity 110. Plugs 118 would then be formed in conduits 116 to seal enclosure 18. Plugs 118 may also be of any suitable material known in the art, such as solder glass or a polymer. Having a fluid with good heat transfer characteristics in direct contact with the electronic component 12 is particularly advantageous in promoting good heat transfer from the electronic component.

It will be understood that the fluid may be placed in the cavity 110 or the enclosure 18 before sealing thereof, thereby obviating the need for conduits 112 and 116; and that conduits 116' may be formed in the first base layer 24 instead of the lid 14.

It will also be understood that providing a fluid in internal cavities such as the cavity 110 and the enclosure 18 may be employed with any of the package configurations described above, among others. Having the enclosure 18 filled with a fluid to promote heat transfer from the electronic component 12 to the lid may be especially advantageous when used with the configuration shown on FIG. 8.

Any suitable fluid may be used which is inert with respect to the materials it will contact and which has good conductive heat transfer properties. When the fluid used is a gas, it is further desirable that it have good convective heat transfer properties. In the case of a liquid, it should also have a high boiling point and low viscosity. Some examples of suitable gasses are helium and hydrogen. Some examples of liquids are high boiling point fluorocarbons and silicone and silicate gels.

When a liquid is used, it should preferably have a coefficient of thermal expansion which is close to that of the materials from which the package is manufactured. If the CTE of the liquid used is substantially greater than that of the materials from which the package is manufactured, cycling of the package after closure to temperatures above the temperature existing at the time of closure could result in development of high internal pressures which could rupture the package. Conversely, thermal cycling the lower temperatures could result in the formation of voids, or bubbles in the liquid medium.

Figure 14:
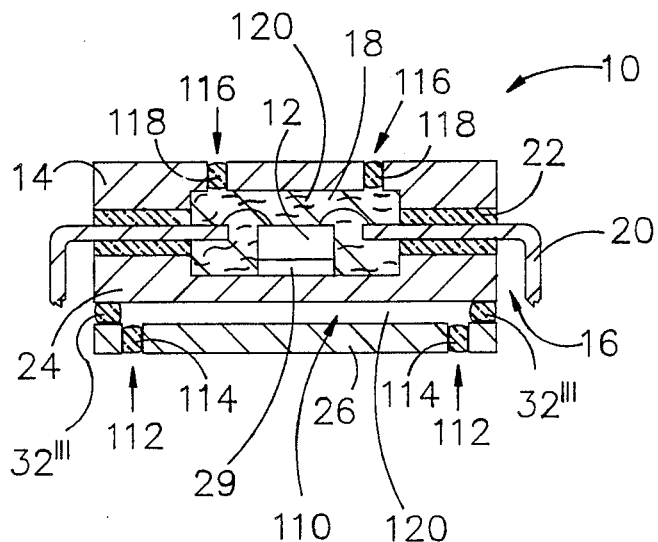
FIG. 14 is a cross section of a package adapted to have a fluid inserted in internal cavities thereof in which the package is adapted to compensate for a mismatch in coefficient of thermal expansion between the package and the fluid.

FIG. 14 shows an embodiment that may be employed when the CTE of the liquid is not close to that of the package materials. Here, a felted material 120 may be placed in cavity 110 and/or enclosure 18 of package 10'' before introduction of the liquid, such that the felted material would act as a "wick," ensuring continuous liquid contact between the components involved without the need for completely filling the cavity or the enclosure with the liquid, thus obviating problems with mis-matched CTEs.

A suitable felted material would be matted fiberglass.

It is also within the intent of the present invention that thermally conductive, electrically insulating powders, either free-flowing or dry-pressed, may be used in place of the fluids discussed above. In such case, the powders may be placed in the cavity 110 and/or the enclosure 18 during the assembly process, without the need for conduits 112 or 116. Suitable powders include ceramics such as $Al_2O_3$, SiC, MgO, BeO, and $AlN_3$.

The sealing materials have been described as sealing glasses or polymers. An embodiment of the present invention would be to use both sealing glass and a polymer sealant within the same electronic package. For example, the sealing material 22 of FIG. 13 sealing the lid component to the base component could be sealing glass for hermeticity while the sealing material 32''' joining the first and second base layers could be polymer for improved chemical resistance. Any other combination of glass and polymer sealing materials may also be used.

The patent and patent applications set forth in this application are intended to be incorporated in their entireties by reference herein.

It is apparent that there has been provided in accordance with this invention metal packages having improved thermal dissipation which satisfies the objects, means and advantages set forth hereinabove. While the invention has been described in combination with the embodiments thereof, it is evident that many alternatives, modifications, and variations will be apparent to those skilled in the art in light of the foregoing description. Accordingly, it is intended to embrace all such alternatives, modifications and all variations as fall within the spirit and broad scope of the appended claims.

We claim:

1. A package adapted to encase an electronic component, comprising;
   a metallic base component split into first and second base layers, said first and second base layers bonded together at an interface with a layer of electrically insulating sealing material wherein said interface is non-planer and increases the area of contact between said first and second base layers;

a metallic lid component disposed on said base component so as to form an enclosure adapted to receive said electronic component;

a metallic leadframe, said leadframe being disposed between said lid component and said base component; and a sealing material sealing said lid component to said base component with said leadframe there between.

2. The package of claim 1 in which the sealing material is a sealing glass.

3. The package of claim 1 in which the sealing material is a polymer from the group consisting of thermoplastic and thermosetting polymers.

4. The package of claim 1 further including an electronic component, said electronic component being disposed in said enclosure and bonded to said first base layer with a first bonding component whereby heat transfer from said electronic component to said first base layer is enhanced.

5. The package of claim 4 further including said first bonding component being an alloy bonding material selected from the group consisting of gold-silicon, gold-tin, silver-tin, silver-antimony-tin and mixtures thereof.

6. The package of claim 5 further including:

a buffer strip disposed between said electronic component and said first base layer to compensate for differences in the coefficient of thermal expansion between the electronic component and the first base layer, said buffer component being bonded to said first base layer with said first bonding component; and a second bonding component bonding said buffer component to said electronic component, said second bonding component being selected from the same group of materials as said first bonding component.

7. The package of claim 5 further including said interface being shaped with a saw tooth configuration.

8. The package of claim 1 further including means to connect said second base layer to a heat sink.

9. The package of claim 1 further including cooling fin means extending from at least one of the ends of said base component.

10. The package of claim 9 wherein said cooling fin means includes first and second cooling fins projecting from the ends of said first base layer outward from said package.

11. The package of claim 10 wherein said first and second cooling fins extend about said package and are in contact with said lid component.

12. The package of claim 9 wherein said cooling fin means includes third and fourth cooling fins projecting from the ends of said second base layer outward from said package.

13. The package of claim 12 wherein said third and fourth fins extend about said package and are in contact with said lid component.

14. The package of claim 1 further comprising:

a groove extending about an edge surface of said base component, said groove being formed in both said first and second base layers; and means disposed in said groove for substantially preventing moisture from being absorbed into said layer of electrically insulating sealing material.

15. The package of claim 14 wherein said means for preventing moisture absorption includes a layer of sealing glass disposed in said groove.

16. The package of claim 15 wherein said means for preventing moisture absorption further includes a strip of ceramic insulator disposed in said groove and affixed therein with said layer of sealing glass.

17. The package of claim 14 wherein said means for preventing moisture absorption includes a layer of organic material disposed in said groove.

18. The package of claim 1 further comprising:

a collar extending about an edge surface of said base component, said collar being formed by a surface of said second base layer extending outward from said first base layer; and means disposed on said collar for substantially preventing moisture from being absorbed into said layer of electrically insulating sealing material.

19. The package of claim 18 wherein said means for preventing moisture absorption is selected from the group consisting of sealing glass, organic material, strips of ceramic and combinations thereof.

20. The package of claim 1 further comprising:

a groove extending about an edge surface of said package, said groove being formed in said first and second base layers and said lid component; and means disposed in said groove for substantially preventing moisture from being absorbed into said layer of sealing material and said layer of electrically insulating sealing material.

21. The package of claim 20 wherein said means for preventing moisture absorption is selected from the group consisting of sealing glass, organic material, strips of ceramic and combinations thereof.

22. The package of claim 1 wherein said insulating sealing material bonds said first and second base layers at the edges of their interface only, thereby forming a sealed cavity therebetween.

23. The package of claim 22 further comprising a fluid placed in said cavity.

24. The package of claim 23 further comprising:

conduits formed in said second base layer for the placing of said fluid; and plugs formed in said conduits to seal said conduits after said placing of said fluid.

25. The package of claim 24 further comprising a felted material placed between said first and second base layers in said cavity, and said fluid is a liquid filling less than entire said cavity.

26. The package of claim 25 wherein said felted material is fiberglass.

27. The package of claim 23 wherein said fluid is selected from the group consisting of air, helium, hydrogen, high boiling point fluorocarbons, silicone gels, and silicate gels.

28. The package of claim 22 further comprising a powder placed in said cavity.

29. The package of claim 28 wherein said powder is selected from the group consisting of powders of alumina, silicon carbide, magnesium oxide, beryllium oxide, and aluminum nitride.

30. The package of claim 1 further comprising a fluid placed in said enclosure.

31. The package of claim 30, further comprising:

conduits for the placing of said fluid in said enclosure; and plugs formed in said conduits to seal said conduits after said placing of said fluid.

32. The package of claim 31 wherein said conduits are formed in said lid component.

33. The package of claim 31 wherein said conduits are formed in said first base layer.

34. The package of claim 30 wherein said fluid is selected from the group consisting of helium, hydrogen, high boiling point fluorocarbons, silicone gels and silicate gels.

35. The package of claim 34 further comprising a felted material placed between said electronic component and said lid component in said enclosure, and said fluid is a liquid filling less than entire said enclosure.

36. The package of claim 35 wherein said felted material is fiberglass.

37. The package of claim 1 further comprising a powder placed in said enclosure.

38. The package of claim 37 wherein said powder is selected from the group consisting of powders of alumina, silicon carbide, magnesium oxide, beryllium oxide, and aluminum nitride.

39. The package of claim 1 wherein said insulating glass bonds said first and second base layers at two opposing edges of their interface only, thereby forming an open channel therebetween.

40. The package of claim 1 in which the sealing materials are a combination of both glass and a polymer from the group consisting of thermoplastic and thermosetting polymers.

* * * * *